United States Patent [19]

Champlin

[11] Patent Number: 5,585,728
[45] Date of Patent: Dec. 17, 1996

[54] ELECTRONIC BATTERY TESTER WITH AUTOMATIC COMPENSATION FOR LOW STATE-OF-CHARGE

[76] Inventor: Keith S. Champlin, 5438 Elliot Ave. South, Minneapolis, Minn. 55437

[21] Appl. No.: 496,467

[22] Filed: Jun. 29, 1995

Related U.S. Application Data

[63] Continuation of Ser. No. 292,925, Aug. 18, 1994, abandoned, which is a continuation of Ser. No. 877,646, May 1, 1992, abandoned.

[51] Int. Cl.$^6$ .......................... G01N 27/416; G01R 31/36
[52] U.S. Cl. ............................................ 324/427; 324/430
[58] Field of Search ............................. 320/48; 324/427, 324/430, 433, 436, 442; 340/636

[56] References Cited

U.S. PATENT DOCUMENTS

| | | | |
|---|---|---|---|
| 3,873,911 | 3/1975 | Champlin | 324/29.5 |
| 3,886,443 | 5/1975 | Miyakawa et al. | 324/29.5 |
| 3,909,708 | 9/1975 | Champlin | 324/29.5 |
| 3,946,299 | 3/1976 | Christianson et al. | 320/43 |
| 4,193,025 | 3/1980 | Frailing et al. | 324/427 |
| 4,423,378 | 12/1983 | Marino et al. | 324/427 |
| 4,697,134 | 9/1987 | Burkum et al. | 320/48 |
| 4,719,428 | 1/1988 | Liebermann | 324/436 |
| 4,816,768 | 3/1989 | Champlin | 324/428 |
| 4,825,170 | 4/1989 | Champlin | 324/436 |
| 4,881,038 | 11/1989 | Champlin | 324/426 |
| 4,912,416 | 3/1990 | Champlin | 324/430 |
| 4,929,931 | 5/1990 | McCuen | 340/636 |
| 4,968,941 | 11/1990 | Rogers | 324/428 |
| 5,047,722 | 9/1991 | Wurst et al. | 324/430 |
| 5,140,269 | 8/1992 | Champlin | 324/433 |

OTHER PUBLICATIONS

Debardelaben, Sheldon, Determining the End of Battery Life, New York Telephone Company, 1986 IEEE, Ch. 2328, pp. 365–368.

Vaccaro, F. J. and Casson, P., Internal Resistance: Harbinger of Capacity Loss in Starved Electrolyte Sealed Lead Acid Batteries, AT&T Bell Laboratories, 1987 IEEE, Ch. 2477, pp. 128–131.

IEEE Recommended Practice for Maintenance, Testings, and Replacement of Large Lead Storage Batteries for Generating Stations and Substations, The Institute of Electrical and Electronics Engineers, Inc., ANSI/IEEE Std. 450–1987, pp. 7–15.

*Primary Examiner*—Kenneth A. Wieder
*Assistant Examiner*—Glenn W. Brown
*Attorney, Agent, or Firm*—Westman, Champlin & Kelly, P.A.

[57] ABSTRACT

Three embodiments of an improved electronic device for testing or monitoring storage batteries that may be only partially charged are disclosed. The device determines the battery's small-signal dynamic conductance in order to provide either a proportional numerical readout, displayed in appropriate battery measuring units, or a corresponding qualitative assessment of the battery's relative condition based upon its dynamic conductance and electrical rating. Without additional user intervention, the device also determines the battery's terminal voltage in an essentially unloaded condition and utilizes this information to automatically correct the measured dynamic conductance. By virtue of this automatic correction, the quantitative or qualitative information displayed to the user conforms with that of a fully-charged battery even though the battery may, in actual fact, be only partially charged. If the battery's state-of-charge is too low for an accurate assessment to be made, no information is displayed. Instead, an indication is made to the user that the battery must be recharged before testing.

26 Claims, 6 Drawing Sheets

ELECTRONIC BATTERY TESTER WITH AUTOMATIC COMPENSATION FOR LOW STATE-OF-CHARGE

This is a continuation of application Ser. No. 08/292,925, filed Aug. 18, 1994, now abandoned, which is a continuation of application Ser. No. 07/877,646, filed May 1, 1992, now abandoned.

BACKGROUND OF THE INVENTION

This invention relates to an electronic measuring or monitoring device for assessing the ability of a storage battery to deliver power to a load. More specifically, it relates to improved apparatus of the type disclosed previously in U.S. Pat. Nos. 3,873,911, 3,909,708, 4,816,768, 4,825,170, 4,881,038, and 4,912,416 issued to Keith S. Champlin.

Storage batteries are employed in many applications requiring electrical energy to be retained for later use. Most commonly, they are employed in motor vehicles utilizing internal combustion engines. In such applications, energy stored by "charging" the battery during engine operation is later used to power lights, radio, and other electrical apparatus when the engine is stopped. The most severe demand upon the battery of a motor vehicle is usually made by the starter motor. Failure to supply the starter motor with sufficient power to crank the engine, particularly in cold weather, is often the first indication of battery deterioration. Clearly, a simple measurement that accurately assesses a battery's ability to supply cranking power is of considerable value.

Prior to the introduction of the dynamic conductance testing method disclosed in the six U.S. patents enumerated above, the method most generally available for assessing a battery's ability to supply cranking power was the standard load test. This test subjects a battery to a heavy dc current having a predetermined value dictated by the battery's rating. After a prescribed time interval, the battery's voltage under load is observed. The battery is then considered to have "passed" or "failed" the load test according to whether its voltage under load is greater, or less, than a particular value.

Although the standard load test has been widely used for many years, it has several serious disadvantages. These include:

1. The test draws a large current and therefore requires apparatus that is heavy and cumbersome.

2. Considerable "sparking" can occur if the test apparatus is connected or disconnected under load conditions. Such "sparking" in the presence of battery gasses can cause an explosion with the potential for serious injury to the user.

3. A standard load test leaves the battery in a significantly reduced state-of-charge and therefore less capable of cranking the engine than before the test was performed.

4. The battery's terminal voltage decreases with time during performance of the load test. Accordingly, test results are generally imprecise and often dependent upon the skill of the operator.

5. Load test results are not repeatable since the test itself temporarily polarizes the battery. Such test-induced polarization significantly alters the initial conditions of any subsequently-performed tests.

A practical alternative to the standard load test is taught in the six U.S. Patents enumerated above. These documents disclose electronic apparatus for accurately assessing a battery's condition by means of small-signal ac measurements of its dynamic conductance. They teach that a battery's dynamic conductance is directly proportional to its dynamic power—the maximum power that the battery can deliver to a load. Dynamic conductance is therefore a direct measure of a battery's ability to supply cranking power. In comparison with the load test method of battery appraisal, the dynamic conductance testing method has many advantages. For example, dynamic conductance testing utilizes electronic apparatus that is small and lightweight, draws very little current, produces virtually no sparking when connected or disconnected, does not significantly discharge or polarize the battery, and yields accurate, highly reproducible, test results. Virtually millions of battery measurements performed over the years have fully corroborated these teachings and have proven the validity of this alternative testing method.

One disadvantage, however, of the dynamic conductance testing method has been the fact that test results are somewhat dependent upon the battery's state-of-charge. Accordingly, the methods and apparatus disclosed in the first five of the six U.S. patents cited above have generally required that the battery be essentially fully charged to be tested. Since many batteries are, in fact, fairly discharged when they are returned for replacement under warranty, or when they are otherwise suspected of being faulty, it has been frequently necessary to recharge a battery before testing it. Such recharging is costly and time-consuming. Clearly, a simple method for performing accurate dynamic conductance tests on batteries "as is"—batteries that may be only partially charged—would be of considerable benefit.

Great progress toward solving this problem has been engendered by the methods and apparatus disclosed in the sixth U.S. patent cited above; U.S. Pat. No. 4,912,416. As is well known to those skilled in the art, a battery's state-of-charge is directly related to its open-circuit (unloaded) terminal voltage. By utilizing this fact, along with extensive experimental data, an empirical relationship was established between a battery's state-of charge, as reflected by its open-circuit voltage, and its relative dynamic conductance, normalized with respect to its fully-charged value. This empirical relationship was first disclosed in U.S. Pat. No. 4,912,416. Further, apparatus disclosed therein utilized this empirical relationship, along with measurements of open-circuit voltage, to appropriately correct dynamic conductance readings—thus yielding battery assessments that were essentially independent of the battery's state-of-charge.

However, the measuring apparatus disclosed in U.S. Pat. No. 4,912,416 utilized an inconvenient two-step testing procedure requiring intermediate interaction by the user. The battery's open-circuit voltage was first measured. Next, using the results of the voltage measurement, the user adjusted a variable attenuator to an appropriate setting. Finally, the dynamic conductance was measured. By virtue of the previously adjusted variable attenuator, the quantitative or qualitative dynamic conductance information ultimately displayed to the user conformed with that of a fully-charged battery even though the battery may, in actual fact, have been only partially charged when tested.

The state-of-charge problem was thus solved in principle by the methods and apparatus taught in U.S. Pat. No. 4,912,416. The required procedure was somewhat inconvenient, however. It is therefore quite apparent that improved apparatus which provides automatic state-of-charge correction—a correction not requiring intermediate interaction by the user—would be highly advantageous. Just such improved electronic battery testing apparatus, providing automatic compensation for low state-of-charge, is disclosed herein below.

SUMMARY OF THE INVENTION

Three embodiments of an improved electronic device for testing or monitoring storage batteries that may be only partially charged are disclosed. The device determines the battery's small-signal dynamic conductance in order to provide either a proportional numerical readout, displayed in appropriate battery measuring units, or a corresponding qualitative assessment of the battery's relative condition based upon its dynamic conductance and electrical rating. Without additional user intervention, the device also determines the battery's terminal voltage in an essentially unloaded condition and utilizes this information to automatically correct the measured dynamic conductance. By virtue of this automatic correction, the quantitative or qualitative information displayed to the user conforms with that of a fully-charged battery even though the battery may, in actual fact, be only partially charged. If the battery's state-of-charge is too low for an accurate assessment to be made, no information is displayed. Instead, an indication is made to the user that the battery must be recharged before testing.

The electronic battery testing/monitoring device with automatic compensation for low state-of-charge hereof can be used to obtain either a qualitative or quantitative assessment of a wide variety of electrochemical energy sources other than lead-acid batteries. For example, single electrochemical cells can be tested or monitored in a manner identical to that applied to testing or monitoring batteries of series-connected cells. Furthermore, by utilizing appropriate numerical correction factors, the invention can be used to test or monitor other electrochemical energy sources such as alkaline, nickel-cadmium, or lithium cells and batteries. The invention hereof is widely applicable to such testing or monitoring of energy sources by virtue of its simplicity, its safety, its accuracy, its ease of operation, and its low cost.

DETAILED DESCRIPTION OF THE PREFERRED EMBODIMENTS

Figure 1:
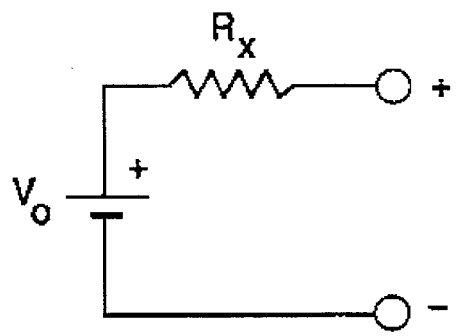
FIG. 1 depicts the Thevenin's equivalent circuit of a lead-acid storage battery comprising its open-circuit voltage, $V_o$, and its internal resistance, $R_x$, connected in series.

Referring first to FIG. 1, the Thevenin's equivalent circuit of a lead-acid storage battery is shown. In this equivalent representation, the battery is described by its open-circuit voltage, $V_o$, and its internal resistance, $R_x$, connected in series.

As has been fully disclosed in the first five of the six U.S. Patents cited above, a conventional dynamic conductance battery test of a fully-charged battery traditionally ignores the open-circuit voltage, $V_o$. Instead, the electronic test apparatus directly measures the battery's dynamic conductance $G_x=1/R_x$. The testing/monitoring device then provides the operator with either a numerical readout displayed in proportional battery measuring units (such as "Cold Cranking Amps", "Ampere-Hours", or "Watts"), or else with a qualitative display ("Pass/Fail") based upon comparing the measured value of $G_x$ with a corresponding reference value determined from the battery's electrical rating and temperature.

Although the open-circuit voltage, $V_o$, has not been normally used in dynamic conductance testing of fully-charged batteries, it has been previously used to determine state-of-charge. As is well known to those skilled in the art, a battery's state-of-charge is directly related to its open-circuit (unloaded) terminal voltage. For example, with automotive-type lead-acid batteries having a nominal voltage of 12 volts, the open-circuit voltage is known to vary from about 11.4 volts, for batteries that are virtually totally discharged, to about 12.6 volts, for batteries that are nearly fully charged.

Figure 2:
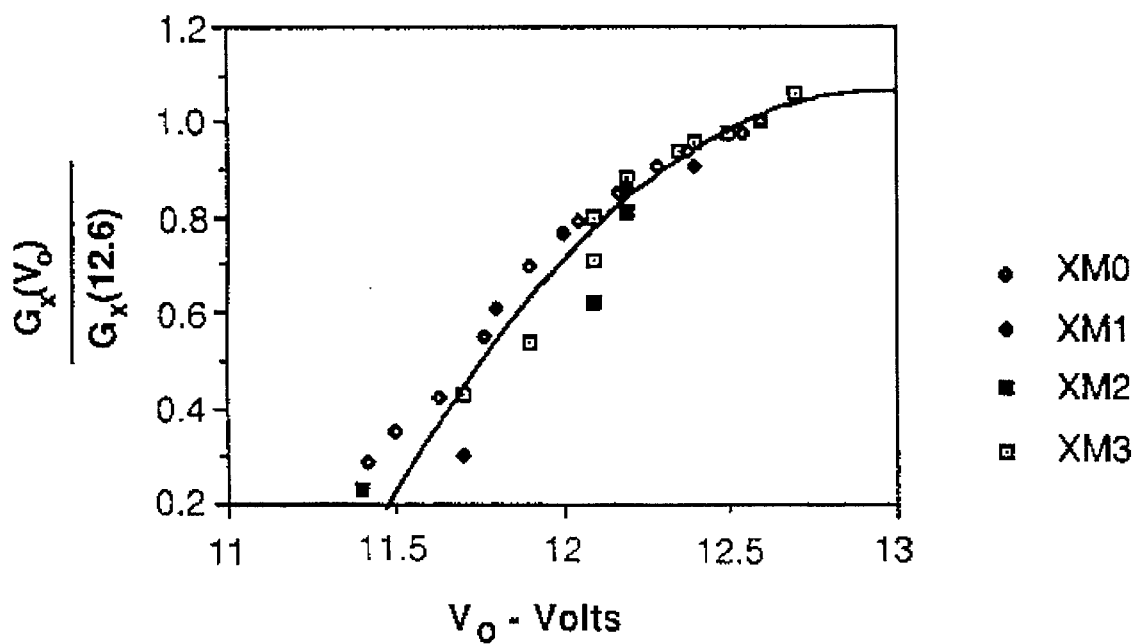
FIG. 2 is an empirical plot of normalized dynamic conductance, $G_x$, versus open-circuit voltage, $V_o$, showing the correlation with measurements performed upon four different lead-acid storage batteries having differing electrical ratings and fabricated by different manufacturers.

FIG. 2 shows the observed relationship between normalized dynamic conductance and open-circuit voltage appropriate to a large class of automotive-type lead-acid storage batteries. This information was disclosed previously in U.S. Pat. No. 4,912,416. FIG. 2 displays an empirical graph of relative dynamic conductance, normalized with respect to the fully-charged value, $G_x(V_o)/G_x(12.6)$, plotted as a function of open-circuit voltage, $V_o$. The solid curve plotted in FIG. 2 is described by a second-order polynomial equation having coefficients adjusted to best fit the experimental data. The appropriately adjusted polynomial equation is:

Equation 1:
$$\frac{G_x(V_x)}{G_x(12.6)} = -\{78.1963\} + \{12.3939\}V_o - \{0.4848\}V_o^2$$

FIG. 2 also discloses normalized experimental points which represent actual measurements obtained from four different batteries possessing different electrical ratings and fabricated by different manufacturers. Batteries XM0, XM1, and XM3 are six-cell batteries having nominal voltages of 12 volts. Battery XM2 is actually a three-cell, 6-volt battery. Open-circuit voltage measurements of battery XM2 were multiplied by a factor of two in order to plot XM2 data points on the same graph as the other three batteries. One sees that the normalized measurements obtained from all four batteries agree quite closely with the empirical relation described by Equation 1. The fact that the same empirical relation shows strong correlation with experimental data obtained from both 6-volt and 12-volt batteries indicates that the empirical state-of-charge correction disclosed in FIG. 2 is quite universal and is actually a fundamental property of a single cell.

Figure 3:
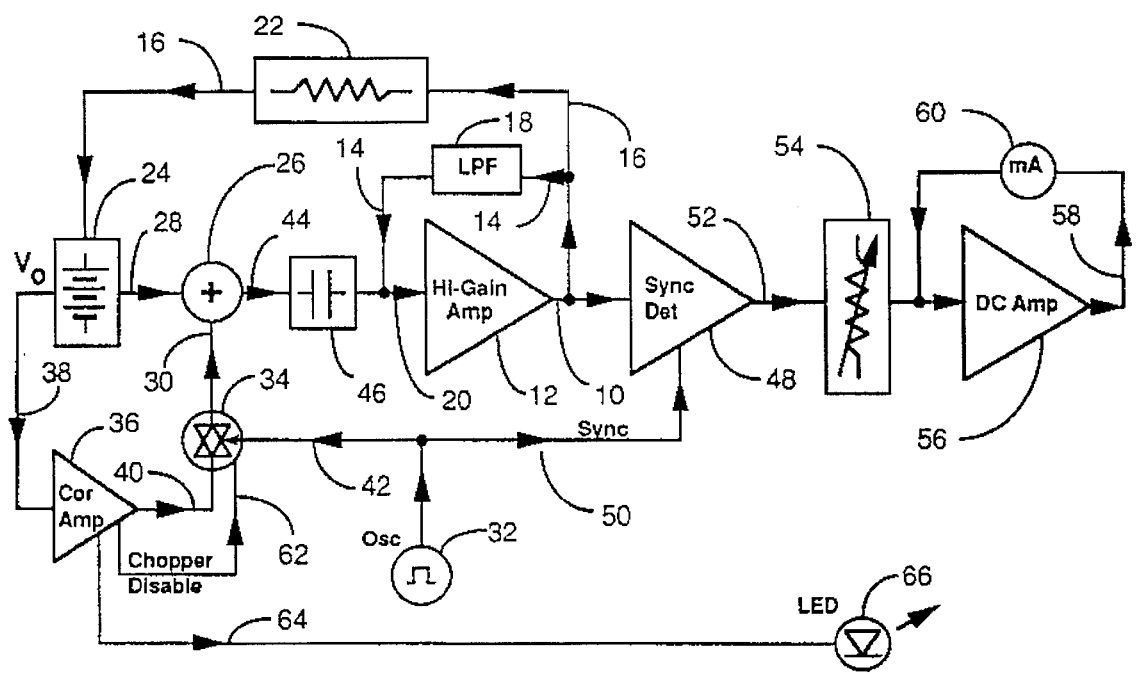
FIG. 3 is a simplified block diagram of an improved electronic battery testing/monitoring device employing automatic compensation for low state-of-charge in accordance with a first embodiment of the present invention.

Referring now to FIG. 3, a simplified block diagram of a first embodiment of an improved electronic battery testing/ monitoring device with automatic compensation for low state-of-charge is disclosed. Except for specific details having to do with the circuitry for automatic compensation for low state-of-charge, the explanation of the operation of the block diagram of FIG. 3 is identical with that of the corresponding block diagram referred to as FIG. 1 in U.S. Pat. No. 4,816,768.

Accordingly, signals representative of the signal at output 10 of high-gain amplifier cascade 12 are fed back to input 20 of high-gain amplifier cascade 12 by means of two feedback paths; internal feedback path 14 and external feedback path 16. Internal feedback path 14 includes low pass filter (LPF) 18 and feeds a signal directly back to input 20 of high-gain amplifier cascade 12. The purpose of internal feedback path 14 and low pass filter 18 is to provide large dc feedback but relatively little ac feedback in order to define the operating point of high-gain amplifier cascade 12 and ensure its dc stability without appreciably reducing its ac voltage gain. External feedback path 16 contains resistive network 22 and feeds a signal current back to the battery undergoing test 24. Summation circuitry 26 combines the resulting signal voltage 28 developed thereby across battery 24 with a periodic square-wave signal voltage 30.

In the embodiment disclosed in FIG. 3, the periodic square-wave signal voltage 30 is formed by the action of oscillator 32, chopper switch 34, and dc correction amplifier (Cor Amp) 36. The oscillation frequency of oscillator 32 may, for example, be 100 Hz. The voltage applied to input 38 of dc correction amplifier 36 is the dc terminal voltage of battery 24. By virtue of the fact that the electronic apparatus disclosed in FIG. 3 draws very little load current from the battery, this terminal voltage is essentially the battery's open-circuit (unloaded) terminal voltage $V_o$. Signal output 40 of dc correction amplifier 36 is a dc voltage derived from $V_o$ having a voltage level that is inversely related to $V_o$—and hence inversely related to the state-of-charge of battery 24. This derived dc voltage 40 is repetitively interrupted by chopping switch 34 whose control input 42 is activated by the output of oscillator 32. The chopped dc voltage thus comprises a periodic square-wave signal voltage 30 having a voltage amplitude that is inversely related to $V_o$, and hence inversely related to the state-of-charge of battery 24. This signal voltage 30 is presented to summation circuitry 26 along with the signal voltage 28 developed across battery 24. The resulting composite signal voltage 44 at the output of summation circuitry 26 is then capacitively coupled to input 20 of high-gain amplifier cascade 12 by means of capacitive coupling network 46.

As has been fully explained in U.S. Pat. No. 4,816,768, the voltage at output 10 of high-gain amplifier cascade 12 comprises a constant dc bias component along with an ac signal component that is proportional to the dynamic conductance $G_x$ of the battery undergoing test 24 as well as to the level of the square-wave signal voltage 30. The constant dc bias component is ignored while the variable ac signal component is detected and accurately converted to a dc signal voltage by synchronous detector 48, synchronized to oscillator 32 by means of synchronizing path 50.

The dc signal voltage at output 52 of synchronous detector 48 passes through adjustable resistive network 54 to the input of dc-coupled operational amplifier 56. Feedback path 58 of operational amplifier 56 contains dc milliammeter 60. Accordingly, the reading of dc milliammeter 60 is proportional to the dc signal voltage level at the output 52 of synchronous detector 48, and hence to the dynamic conductance $G_x$ of battery 24. In addition, the constant of proportionality relating the milliammeter reading to $G_x$ is determined by the value assumed by adjustable resistive network 54 as well as by the level of the signal voltage at 30—and hence by the battery's state-of-charge as exemplified by its unloaded dc terminal voltage $V_o$.

By utilizing an appropriate fixed resistance value in resistive network 54 and then calibrating milliammeter 60 in battery measuring unit numbers that are proportional to the battery's dynamic conductance, the embodiment disclosed in FIG. 3 will emulate the direct reading battery tester disclosed in U.S. Pat. No. 3,873,911. In addition, as is fully taught in U.S. Pat. No. 4,816,768, the resistance value of resistive network 54 which brings the reading of dc milliammeter 60 to a particular fixed value is directly proportional to the dynamic conductance of battery 24. Hence, by calibrating resistive network 54 in traditional battery rating units, and then designating "pass" and "fail" regions on the face of milliammeter 60, the embodiment disclosed in FIG. 3 will also emulate the "pass-fail" battery testing device disclosed in U.S. Pat. No. 3,909,708. Furthermore, one can employ a switch to select either a fixed-valued resistive network 54 or an adjustable-valued network 54 and can arrange both a number scale and "pass-fail" regions on the face of milliammeter 60. One can therefore realize both a direct-reading battery tester and a "pass-fail" battery tester with a single device.

For either emulation, the amplitude of the detected signal at the output 52 of synchronous detector 48 is directly proportional to the amplitude of the square-wave signal 30 at the output of chopper switch 34. Hence, both the level of the numerical quantity displayed during direct-reading operation as well as the relative qualitative assessment provided in "pass-fail" operation are influenced by the battery's "state-of-charge", as exemplified by its unloaded terminal voltage $V_o$. In order for this displayed information to be independent of the battery's state-of-charge, one must require $V_{out}$, the dc output voltage at 40 of dc correction amplifier 36, to be proportional to the reciprocal of $G_x(V_o)$. Under these conditions, $V_{out}$ can be written as:

Equation 2:
$$V_{OUT}(V_o) = V_{OUT}(12.6) \times F(V_o)$$

where

Equation 3:
$$F(V_o) = \frac{G_x(12.6)}{G_x(V_o)}$$

is an appropriate state-of-charge "correction factor" imposed by correction amplifier 36. Rearranging Equation 2 leads to:

Equation 4:
$$F(V_o) = \frac{V_{out}(V_o)}{V_{out}(12.6)}$$

which shows that $F(V_o)$ may be simply regarded as the dc output voltage of amplifier 36 normalized with respect to the corresponding dc output voltage obtained with a fully-charged battery; i.e., a battery for which $V_o=12.6$ volts.

In addition to providing a dc signal output 40, the dc correction amplifier 36 also provides a "Chopper Disable"

output 62 and an LED output 64. These two additional outputs become activated whenever the battery's terminal voltage $V_o$, and hence its state-of-charge, is too small for an accurate dynamic conductance test to be made. Under these special conditions, chopper switch 34 becomes disabled so that no qualitative or quantitative information is displayed to the user. Instead, LED 66 lights to indicate to the user that the battery must be recharged before it can be tested.

Figure 4:
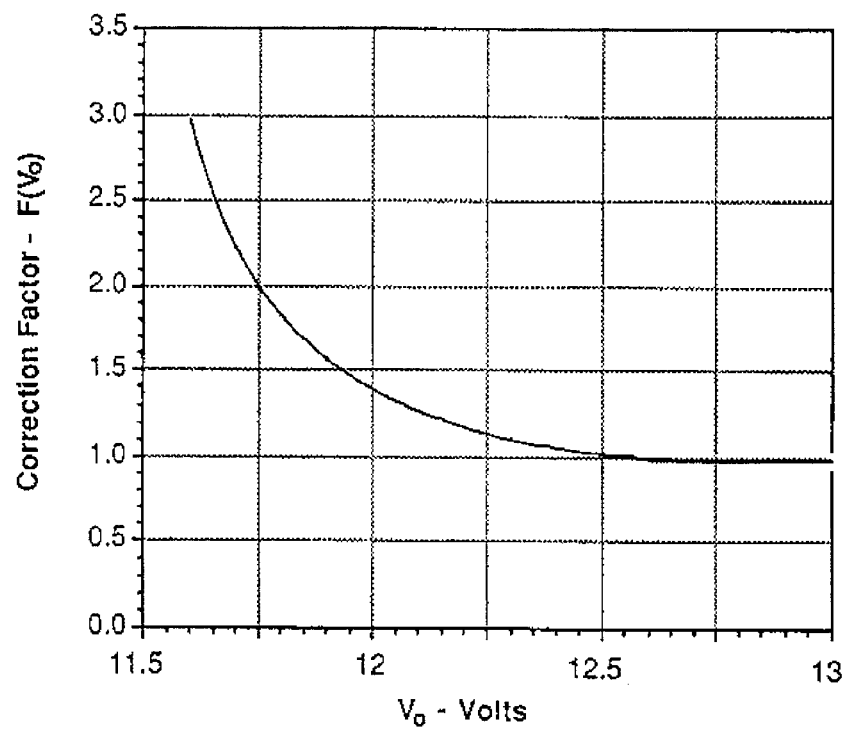
FIG. 4 is a graphical plot of the state-of-charge correction factor obtained by taking the reciprocal of the empirical normalized dynamic conductance curve of FIG. 2.

FIG. 4 displays a graphical plot of the state-of-charge correction factor $F(V_o)$ obtained by taking the reciprocal of the empirical $[G_x(V_o)/G_x(12.6)]$ curve disclosed in FIG. 2. A four-segment piecewise-linear approximation to this empirical curve is disclosed in FIG. 5. The parameters which specify the four breakpoints of this piecewise-linear approximation are listed in Table I.

TABLE I

| PIECEWISE-LINEAR APPROXIMATION PARAMETERS | | |
|---|---|---|
| Breakpoint | $V_o$(Volts) | Correction Factor-F |
| A | 12.60 | 1.00 |
| B | 12.15 | 1.21 |
| C | 11.80 | 1.78 |
| D | 11.60 | 2.91 |

Figure 5:
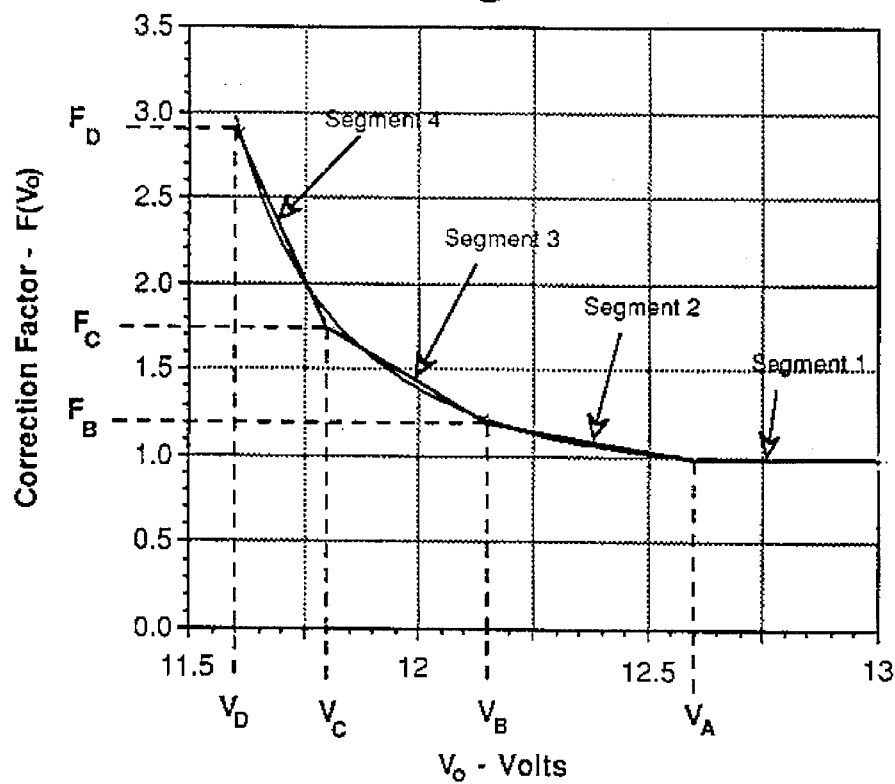
FIG. 5 is a plot of a four-segment piecewise-linear approximation to the correction factor curve of FIG. 4 implemented by the correction amplifier circuit disclosed in FIG. 6.
Figure 6:
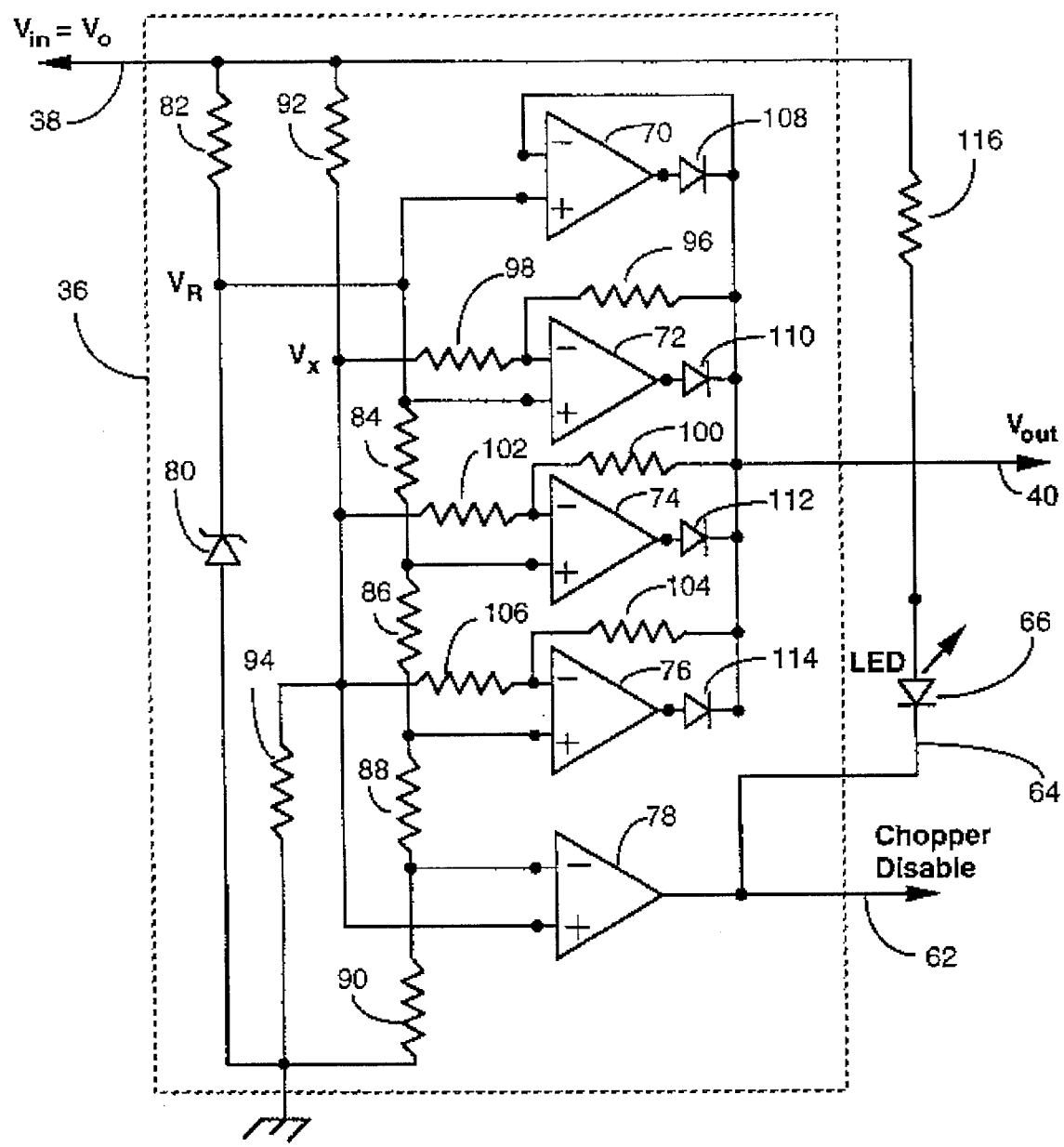
FIG. 6 is a schematic diagram of a dc correction amplifier embodiment which implements the four-segment piecewise-linear transfer function disclosed in FIG. 5.

The piecewise-linear input-output relationship of FIG. 5 is implemented by the transfer function of the dc correction amplifier circuit embodiment disclosed in FIG. 6. Referring now to FIG. 6, the dc correction amplifier contained generally in block 36 comprises the interconnection of four operational amplifiers, 70, 72, 74, and 76 along with comparator 78. Circuit input lead 38 connects to the positive terminal of the battery 24 under test, while the negative battery terminal is grounded. By virtue of the fact that very little current is drawn from battery 24, the circuit's input voltage at 38, $V_{in}$, measured with respect to ground, is essentially equal to the battery's open-circuit terminal voltage $V_o$.

Within the dc correction amplifier circuit disclosed in FIG. 6, a constant reference voltage $V_R$ is established by means of voltage reference diode 80 receiving operating current through series resistor 82. Reference voltage $V_R$ may, for example, be 2.5 volts. $V_R$ is further operated on by a voltage divider chain comprising resistors 84, 86, 88, and 90. Accordingly, the voltage level applied to the noninverting inputs of operational amplifiers 70 and 72 is $V_R$, while increasingly smaller fractions of reference voltage $V_R$ are applied to the noninverting inputs of operational amplifiers 74 and 76 and to the inverting input of comparator 78, respectively. In addition to these fixed voltage levels, a variable voltage $V_x$, that is proportional to battery voltage $V_o$ is derived from $V_{in}$ by means of voltage divider resistors 92 and 94. This variable voltage is applied directly to the non-inverting input of comparator 78 and to the inverting inputs of operational amplifiers 72, 74, and 76 through resistors 98, 102, and 106, respectively.

The outputs of the four operational amplifiers, 70, 72, 74, and 76, are connected to a common output bus, $V_{out}$, through the four diodes, 108, 110, 112, and 114, respectively. Because of the operation of these four diodes, only one of the operational amplifiers will be active at any one given time—the amplifier having the largest (most positive) output voltage. That operational amplifier alone will be connected to the output bus and will thus be controlling the output voltage $V_{out}$. The other three operational amplifiers, those having smaller output voltages, will be disconnected from the output bus by virtue of their having reverse-biased diodes in their output circuits.

Operational amplifier 70 has its inverting input connected directly to the output bus and is therefore configured as a unity-gain voltage-follower amplifying the reference voltage $V_R$. Operational amplifiers 72, 74, and 76 utilize feedback resistors and are configured as inverting amplifiers; each amplifying the variable voltage $V_x$; and each providing a negative incremental voltage gain given, respectively, by the appropriate resistance ratio {R(96)/R(98)}, {R(100)/R(102)}, or {R(104)/R(106)}.

The circuit of FIG. 6 functions as follows: For $V_{in}>V_A=$ 12.6 volts, the output voltage of operational amplifier 70 will be larger than the output voltages of the other three operational amplifiers. Accordingly, the output bus will be controlled by the unity-gain voltage-follower amplifier 70 so that $V_{out}=V_R$. This region of constant output-voltage is represented by segment 1 in the piecewise-linear transfer function displayed in FIG. 5.

When $V_{in}$ has decreased to $V_A=12.6$ volts, $V_x$ will have become sufficiently less than $V_R$ that the output of inverting amplifier 72 will equal that of amplifier 70. Thus, for $V_{in}<V_A$, diode 108 will be reverse biased while diode 110 will be forward biased, and amplifier 72 will control the output bus. Due to the amplification of inverting amplifier 72, further decreases in $V_{in}$ will cause $V_{out}$ to increase with incremental gain or "slope" of −{(R96)/R(98)}. This region of amplification, which continues until $V_{in}=V_B$, is represented by segment 2 in FIG. 5.

When $V_{in}$ has decreased to $V_B$, $V_x$ will have decreased sufficiently that the output of inverting amplifier 74 will exceed that of amplifier 72. Diode 110 will therefore be reverse biased while diode 112 will be forward biased, and amplifier 74 will now control the output bus. Due to the amplification of inverting amplifier 74, further decreases in $V_{in}$ will cause $V_{out}$ to increase with the larger incremental gain or "slope" of −{R(100)/R(102)}. This region of amplification continues until $V_{in}=V_C$ and is represented by segment 3 in FIG. 5.

When $V_{in}$ has decreased to $V_C$, $V_x$ will have decreased sufficiently that the output of inverting amplifier 76 will exceed that of amplifier 74. Diode 112 will therefore be reverse biased while diode 114 will be forward biased. Thus, amplifier 76 will now control the output bus. Due to the amplifying action of inverting amplifier 76, any further decreases in $V_{in}$ will cause $V_{out}$ to increase with the still larger incremental gain or "slope" −{R(104)/R(106)}. This region of largest amplification is represented by segment 4 in FIG. 5.

Finally, for $V_{in}<V_D$, the derived voltage $V_x$ will be less than the tapped-down reference voltage existing at the point of interconnection of resistors 88 and 90. Under these special conditions, the noninverting input of comparator 78 will be at a lower potential than the inverting input thus causing comparator 78's output to be in a "low" state. As a consequence, LED 66 will be lit to provide an indication to the user that the battery must be recharged before it can be tested. In addition, output line 62 will be in a "low" state, thus disabling chopper switch 34 and preventing any qualitative or quantitative dynamic conductance information from being conveyed to the user.

Figure 7:
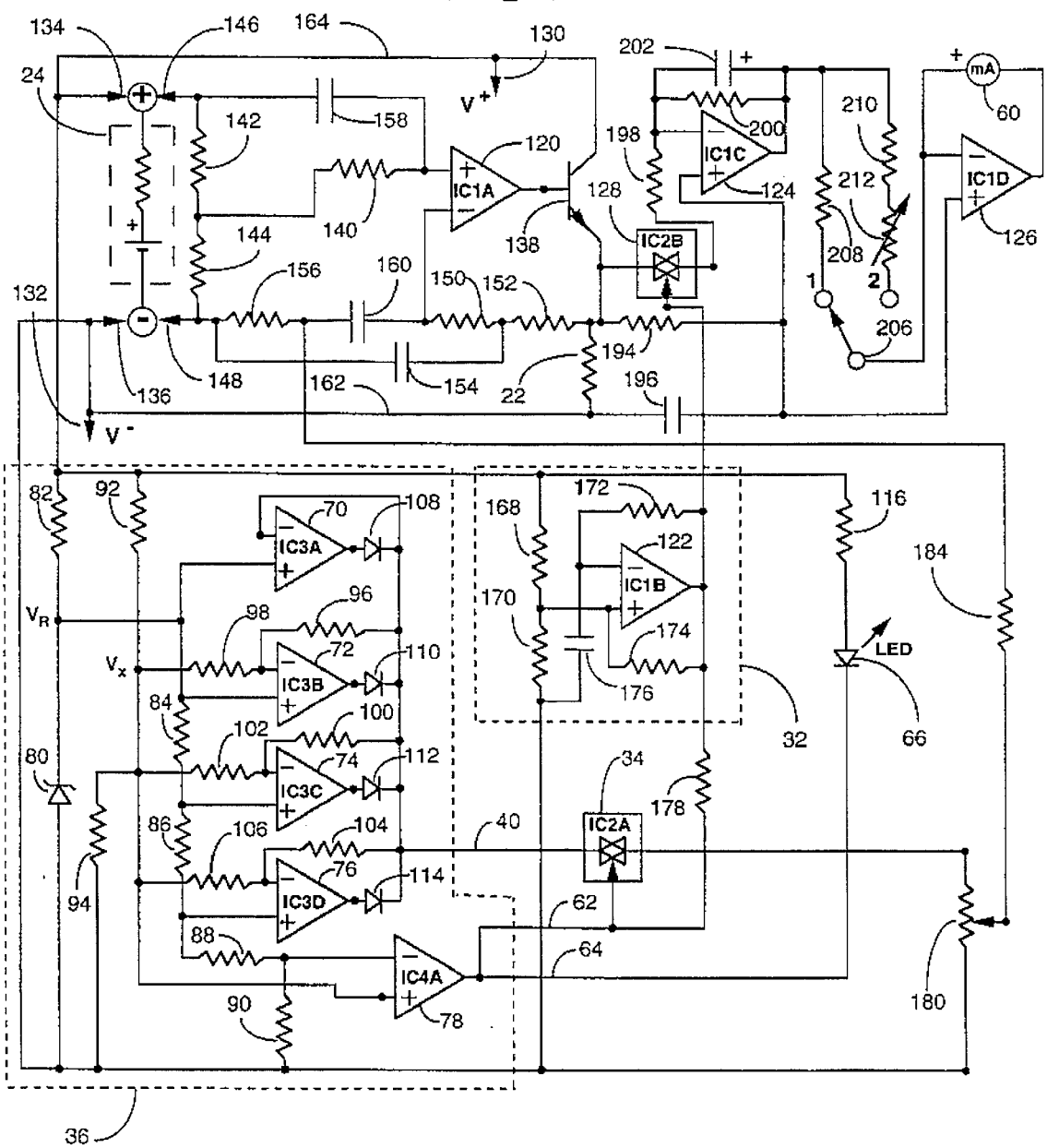
FIG. 7 is a complete schematic diagram of an improved electronic battery testing/monitoring device with automatic compensation for low state-of-charge configured for testing/monitoring 12-volt automotive batteries in accordance with a first embodiment of the present invention.

FIG. 7 discloses a complete schematic diagram of a first embodiment of an improved electronic battery testing/monitoring device with automatic state-of-charge compensation configured for testing/monitoring 12-volt batteries in accordance with the present invention. Operational amplifiers 120, 122, 124, and 126 comprise four elements of a quad operational amplifier integrated circuit, IC1. Bilateral analog switches 34 and 128 comprise two elements of a quad CMOS bilateral switch integrated circuit, IC2. Operational amplifiers 70, 72, 74, and 76 comprise four elements of a quad operational amplifier integrated circuit, IC3. Comparator 78 comprises one element of a quad comparator integrated circuit IC4. All four integrated circuits, IC1, IC2, IC3, and IC4 are powered by means of common power connections, V⁺ 130 and V⁻ 132, connected to the battery undergoing test 24 through battery contacts 134 and 136, respectively.

High-gain amplifier cascade 12 of FIG. 3 comprises operational amplifier 120 and npn transistor 138 connected as an emitter follower. Resistor 140 conducts a dc bias voltage to the noninverting (+) input of operational amplifier 120 from voltage divider resistors 142 and 144 which are connected to battery 24 through battery contacts 146 and 148. The output voltage of high-gain amplifier cascade 12 is established across external-path feedback resistor 22. An internal feedback path comprising resistors 150 and 152 conducts the dc voltage at the common connection between the emitter of npn transistor 138 and resistor 22 to the inverting (−) input of operational amplifier 120. Resistors 150 and 152 along with capacitor 154 comprise low-pass filter 18 of FIG. 3.

The ac signal voltage developed across battery 24 is sensed at battery contacts 146 and 148 and added in series to an input signal voltage component established across viewing resistor 156. The resultant composite ac signal voltage is coupled to the differential input of operational amplifier 120 by means of a capacitive coupling network comprising capacitors 158 and 160. A feedback current that is proportional to the voltage established across resistor 22 passes through battery 24 by means of external feedback path conductors 162 and 164 along with battery contacts 134 and 136.

An ac square-wave input signal voltage is established across viewing resistor 156 and is formed by the action of oscillator 32, chopper switch 34, and correction amplifier 36. Oscillator 32, which generates a 100 Hz square-wave synchronizing signal, is a conventional astable multivibrator comprising operational amplifier 122 along with resistors 168, 170, 172, 174, and capacitor 176. The synchronizing output signal of oscillator 32 is conducted to the control input of chopper switch 34 through resistor 178. Accordingly, chopper switch 34 turns on and off periodically at a 100 Hz rate. The signal terminals of chopper switch 118 interconnect the dc signal output 40 of correction amplifier 36 with the input lead of trimmer potentiometer 180 used for initial calibration adjustment. The signal voltage across trimmer potentiometer 180 therefore comprises a 100 Hz square wave having amplitude proportional to the dc output voltage of correction amplifier 36. A signal current proportional to the signal output voltage of trimmer potentiometer 180 passes through injection resistor 184 and is injected into viewing resistor 156 thereby developing a 100 Hz signal voltage across viewing resistor 156. By virtue of the action of correction amplifier 36 described with reference to FIG. 6, the signal voltage across viewing resistor 156 will contain an automatic correction for the state-of-charge of the battery undergoing test. If, however, the battery's state-of-charge is too low for an accurate battery assessment to be made, the correction amplifier's output lines 62 and 64 will be in logic low states. These output lines will, in turn, pull the control input of chopper switch 34 low and pull the cathode of LED 66 low. As a result, chopper switch 34 will be disabled so that no ac signal will be injected into viewing resistor 156, and LED 66 will light to indicate to the user that the battery must be recharged before a dynamic conductance test can be performed.

Analog switch 128 along with operational amplifier 124, which is connected as an integrator, comprise synchronous detector 48 of FIG. 3. Resistor 194 and bypass capacitor 196 comprise a low-pass filter which biases the noninverting input of operational amplifier 124 to the voltage level of the dc bias component developed across feedback resistor 22. A signal current derived from the total voltage at the common connection between resistor 22 and transistor 138 passes through resistor 198 and analog switch 128 to the inverting input of operational amplifier 124. This signal current is periodically interrupted at the oscillator frequency by virtue of the control input of analog switch 128 being connected to the synchronizing output of oscillator 32. Resistor 200 provides negative dc feedback to operational amplifier 124. Integration capacitor 202 serves to smooth the detected voltage signal outputted by operational amplifier 124.

The noninverting input of operational amplifier 126 is biased to the dc level of the noninverting input of operational amplifier 124 while the inverting input of operational amplifier 126 is connected to SPDT selector switch 206. Accordingly, a dc current proportional to the detected signal voltage at the output of operational amplifier 124 passes through milliammeter 60 to the output of operational amplifier 116 by way of one of the two paths selected by selector switch 206. With switch 206 in position 1, the meter current passes through fixed resistor 208. Under these conditions, the disclosed invention emulates a direct reading battery testing device providing a quantitative output displayed in battery measuring units that are proportional to the dynamic conductance of battery 24. With switch 206 in position 2, the meter current passes through fixed resistor 210 and variable resistor 212. Under these conditions the disclosed invention emulates a qualitative, "pass-fail", battery testing device having a manually adjusted battery rating scale that is linearly related to the setting of variable resistance 212, and a rating offset that is determined by the value of fixed resistor 210.

The improved battery testing/monitoring device embodiment having automatic compensation for low state-of-charge disclosed in FIG. 7 is operated as follows: The operator simply connects the device to the battery undergoing test and selects one of the two positions of selector switch 206. If position 1 is selected, meter 60 will display the battery's quantitative condition in appropriate battery measuring units—with the displayed quantitative results having been automatically adjusted to conform with those of a fully-charged battery. If switch 206 is in position 2, and variable resistance 212 has been set in accordance with the battery's rating, meter 60 will display the battery's qualitative ("pass/fail") condition. Again, the displayed results will have been automatically adjusted to conform with those of a fully-charged battery. With either selection, if the battery's state-of-charge is too low for an accurate assessment to be made, no information will be displayed to the user. Instead, an LED will light to indicate to the user that the battery must be recharged before testing.

Table II contains a listing of component types and values for the first embodiment of an improved electronic battery testing/monitoring device with automatic compensation for low state-of-charge disclosed in FIG. 7.

TABLE II

COMPONENT TYPES AND VALUES FOR CIRCUIT OF FIG. 7

| REFERENCE NUMBER | COMPONENT |
|---|---|
| Semiconductor Devices | |
| 120, 122, 124, 126 | IC1 - LM324N |
| 34, 128 | IC2 - CD4066B |
| 70, 72, 74, 76 | IC3 - LM324N |
| 78 | IC4 - LM339 |
| 80 | IC5 - LM336-.25 |
| 138 | TIP31C Power Transistor |
| 108, 110, 112, 114 | 1N4148 Diodes |
| 66 | T-1¾ LED |
| Resistors - Ohms (¼-W unless specified) | |
| 22 | 22Ω - 5 Watts |
| 82 | 4.7K |
| 84 | 5.36K |
| 86 | 6.19K |
| 88 | 6.04K |
| 90 | 200K |
| 92 | 2.25K |
| 94 | 576 |
| 96, 100, 104 | 1.00M |
| 98 | 174K |
| 102 | 49.9K |
| 106 | 13.7K |
| 116, 142, 144 | 1.0K |
| 156, 210 | 100 |
| 208 | 470 |
| 212 | 500 Variable |
| 180 | 10K Trimpot |
| 184 | 470K |
| 140, 200 | 47K |
| 178, 194, 198 | 100K |
| 172 | 150K |
| 174 | 270K |
| 150, 152, 168, 170 | 1 Meg |
| Capacitors - Mfd | |
| 176 | 0.022 |
| 154, 158, 160, 196 | 0.47 |
| 202 | 1.0 |
| Meter | |
| 204 | 1 mA dc milliammeter |
| Switch | |
| 206 | SPDT |

Figure 8:
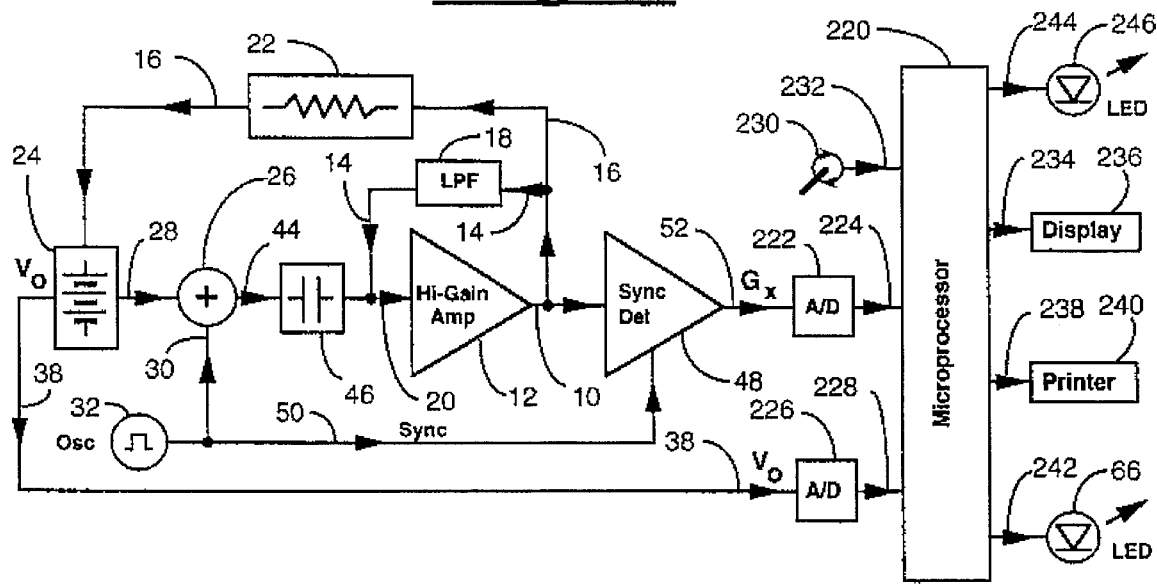
FIG. 8 is a simplified block diagram of a second embodiment of an improved electronic battery testing/monitoring device with automatic compensation for low state-of-charge.

FIG. 8 discloses a simplified block diagram of a second embodiment of an improved electronic battery testing/monitoring device with automatic compensation for low state-of-charge. This embodiment eliminates the correction amplifier 36 and chopper switch 34 of the first embodiment disclosed in block diagram form in FIG. 3. Instead, it contains a microprocessor represented generally by block 220 of FIG. 8. Microprocessor block 220 includes all of the usual elements which comprise a microprocessor system such as the requisite logic elements, a clock oscillator, a random access memory, a firmware program contained in read-only memory, and, of course, the processor itself. With the embodiment of FIG. 8, the appropriate correction for low state-of-charge is performed by microprocessor block 220 under the control of the firmware program contained therein.

A description of operation of most of the elements of FIG. 8 parallels the description of operation of the embodiment disclosed in FIG. 3. Signals representative of the signal at output 10 of high-gain amplifier cascade 12 are fed back to input 20 of high-gain amplifier cascade 12 by means of two feedback paths; internal feedback path 14 and external feedback path 16. Internal feedback path 14 includes low pass filter (LPF) 18 and feeds a signal voltage directly back to input 20 of high-gain amplifier cascade 12. External feedback path 16 contains resistive network 22 and feeds a signal current back to the battery undergoing test 24. Summation circuitry 26 combines the resulting signal voltage 28 developed thereby across battery 24 with a periodic square-wave signal voltage 30.

In the embodiment of FIG. 8, signal voltage 30 simply comprises the constant output signal of oscillator 32. The oscillation frequency of oscillator 32 may, for example, be 100 Hz. This periodic signal voltage is presented to summation circuitry 26 along with the signal voltage 28 developed across battery 24. The resulting composite signal voltage 44 at the output of summation circuitry 26 is then capacitively coupled to input 20 of high-gain amplifier cascade 12 by means of capacitive coupling network 46. Accordingly, the voltage at output 10 of high-gain amplifier cascade 12 comprises a constant dc bias component along with an ac signal component that is proportional to the dynamic conductance $G_x$ of the battery undergoing test 24. The constant dc bias component is ignored while the variable ac signal component is detected and accurately converted to a dc signal voltage by synchronous detector 48, synchronized to the oscillator by means of synchronizing path 50.

The dc signal level at output 52 of synchronous detector 50 is proportional to the battery's dynamic conductance $G_x$. This analog voltage is converted to a corresponding digital representation of $G_x$ by analog to digital (A/D) converter 222 and then inputted to microprocessor block 220 through input port 224. In addition, the battery's unloaded voltage $V_o$ is connected via dc path 38 to the input of analog to digital converter 226. A corresponding digital representation of $V_o$ at the output of A/D converter 226 is thereby inputted to microprocessor block 220 through input port 228.

By programmed algorithmic techniques that are well-known to those skilled in the art, the microprocessor's firmware program utilizes the digital representation of $V_o$ to correct the digital representation of $G_x$ for the battery's state-of-charge. This can be done, for example, by inputting $V_o$ to a "look-up table" whose output is the corresponding correction factor F, and then multiplying $G_x$ by the resulting factor F to obtain the corrected conductance value, $G_x(12.6)$. Alternatively, the appropriate value of $G_x(12.6)$ could be calculated directly by numerically evaluating the reciprocal of the empirical relationship disclosed in Equation 1.

In order to emulate of a quantitative-type electronic battery tester, a numerical value proportional to $G_x(12.6)$ is outputted and displayed on a digital display such as 236 interfaced through output port 234, or printed by a printer such as 240 interfaced to microprocessor 220 through output port 238. In addition, whenever $V_o$ is less than a predetermined minimum value, the firmware program suppresses the numerical display and instead provides an indication to the user that the battery must be recharged before testing. This special information can, for example, be displayed by digital display 236, printed by printer 240, or conveyed to the user by an LED 66 interfaced to microprocessor 220 through output port 242.

For emulation of a qualitative ("pass/fail") electronic battery tester, the battery's rating is first inputted to microprocessor 220 through an input device such as a shaft encoder 230 interfaced to microprocessor 220 through input port 232. A dial associated with shaft encoder 230 is calibrated in battery rating units such as cold cranking amperes or ampere-hours. By programmed algorithmic techniques that are well-known to those skilled in the art, the microprocessor's firmware program then directs microprocessor block 220 to compare the dynamic conductance corrected for state-of-charge, $G_x(12.6)$, with a reference value appropriate to the inputted battery rating and to output the resulting pass/fail information to the user. This qualitative output information can, for example, be displayed by digital display 236, printed by printer 240, or conveyed to the user by an LED 246 interfaced to microprocessor 220 through output port 244. Again, if $V_o$ is less than a predetermined minimum value, the displayed information is suppressed and the user is informed that the battery must be recharged before testing. This special information can, for example, be displayed by digital display 236, printed by printer 240, or conveyed to the user by LED 66.

Figure 9:
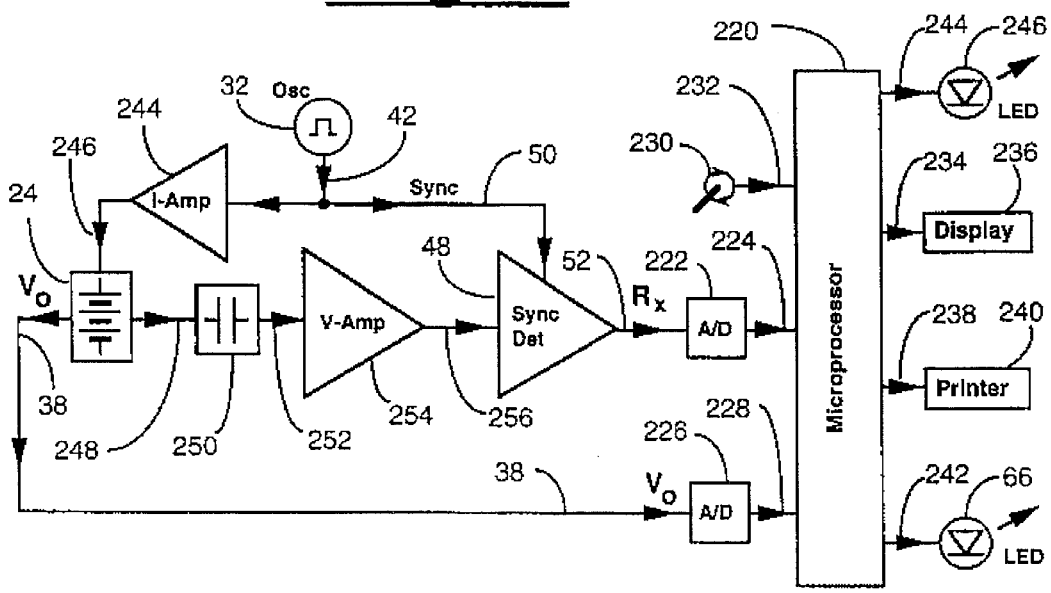
FIG. 9 is a simplified block diagram of a third embodiment of an improved electronic battery testing/monitoring device with automatic compensation for low state-of-charge.

FIG. 9 discloses a simplified block diagram of a third embodiment of an improved electronic battery testing/monitoring device with automatic compensation for low state-of-charge. Like the embodiment disclosed in FIG. 8, this third embodiment employs a microprocessor block 220 to implement the appropriate correction for low state-of-charge. It differs from the embodiment of FIG. 8, however, in that the hardware inputs a digital representation of the battery's dynamic resistance $R_x$ to microprocessor 220 which then utilizes its firmware program to calculate the reciprocal quantity, the battery's dynamic conductance $G_x=1/R_x$, as well as to correct for the battery's state-of-charge.

The hardware disclosed in FIG. 9 functions as follows: Oscillator 32 generates a periodic square-wave signal 42 which is inputted to directly to current amplifier 244. The oscillation frequency of oscillator 32 may, for example, be 100 Hz. The output of current amplifier 244, a periodic signal current 246, then passes through battery 24. By virtue of the fact that the output resistance of current amplifier 244 is much larger than the battery's dynamic resistance $R_x$, the amplitude of signal current 246 will be virtually independent of $R_x$. Accordingly, the resultant ac signal voltage 248 appearing across the battery's terminals will be directly proportional to the battery's dynamic resistance $R_x$. Capacitive coupling network 250 couples the ac signal voltage 248 to input 252 of voltage amplifier 254. This coupling network suppresses the battery's dc terminal voltage but permits amplification of the ac signal voltage by voltage amplifier 254. The output voltage 256 of voltage amplifier 254 provides the input to synchronous detector 48 which is synchronized to oscillator 32 by means of synchronizing path 50. Accordingly, a dc signal voltage 52 appears at the output of synchronous detector 48 that is directly proportional to the battery's dynamic resistance $R_x$.

The analog voltage 52 is converted to a corresponding digital representation of $R_x$ by analog to digital (A/D) converter 222 and then inputted to microprocessor block 220 through input port 224. In addition, the battery's unloaded voltage $V_o$ is connected via dc path 38 to the input of analog to digital converter 226. A corresponding digital representation of $V_o$ at the output of A/D converter 226 is thereupon inputted to microprocessor block 220 through input port 228.

By programmed algorithmic techniques that are well-known to those skilled in the art, the microprocessor's firmware program directs microprocessor block 220 to invert the digital representation of $R_x$ to obtain a digital representation of the battery's dynamic conductance $G_x$. It then utilizes the digital representation of $V_o$ to correct the digital representation of $G_x$ for the battery's state-of-charge. This can be done, for example, by inputting $V_o$ to a "look-up table" whose output is the corresponding correction factor F, and then multiplying $G_x$ by the resulting factor F to obtain the corrected conductance value, $G_x(12.6)$; or by computing $G_x(12.6)$ directly from the reciprocal of the empirical relationship disclosed in Equation 1. Alternatively, a temperature-corrected value of $R_x$, $R_x(12.6)$, can be computed first and then algorithmically inverted to obtain $G_x(12.6)$.

In order to emulate a quantitative-type electronic battery tester, a numerical result proportional to $G_x(12.6)$ is outputted and displayed on a digital display such as 236 interfaced through output port 234, or printed by a printer such as 240 interfaced to microprocessor 220 through output port 238. In addition, whenever $V_o$ is less than a predetermined minimum value, the firmware program suppresses the numerical display and instead provides an indication to the user that the battery must be recharged before testing. This information can, for example, be displayed by digital display 236, printed by printer 240, or conveyed to the user by an LED 66 interfaced to microprocessor 220 through output port 242.

For emulation of a qualitative ("pass/fail") type of electronic battery tester, the battery's rating is inputted to microprocessor 220 through an input device such as a shaft encoder 230 interfaced to microprocessor 220 through input port 232. A dial associated with shaft encoder 230 is calibrated in battery rating units such as cold cranking amperes or ampere-hours. By programmed algorithmic techniques that are well-known to those skilled in the art, the microprocessor's firmware program directs microprocessor block 220 to compare the computed quantity, $G_x(12.6)$, with a reference quantity appropriate to the inputted battery rating to determine whether the battery passes or fails. For a computed quantity larger than the reference quantity, the battery passes. Otherwise it fails. Alternatively, a comparison can be made between the computed quantity $R_x(12.6)$ and a corresponding reference quantity appropriate to the inputted battery rating to determine whether the battery passes or fails. For a computed quantity less than the reference quantity, the battery passes. Otherwise it fails. In either case, this qualitative information is outputted and displayed by digital display 236, printed by printer 240, or conveyed to the user by an LED 246 interfaced to microprocessor 220 through output Port 244. Again, if $V_o$ is less than a predetermined minimum value, the display of qualitative information is suppressed and the user is informed that the battery must be recharged before testing. This special information can, for example, be displayed by digital display 236, printed by printer 240, or conveyed to the user by LED 66.

Although three specific modes for carrying out the invention hereof have been described, it should be understood that many modifications and variations can be made without departing from what is regarded to be the scope and subject matter of the invention. For example, the invention may comprise a single, self-contained, instrument that is temporarily connected to the battery to test the battery on-site. Alternatively, the device may comprise a monitoring device that is semi-permanently connected to the battery to provide continuous monitoring of the battery's condition at a remote location. In this latter case, the device will probably be separated into two parts—one part connected to the battery and located at the battery's site; the other part containing the remote display and located at the remote location. The division between the two parts can be made somewhat arbitrarily. However, I contend that all such divisions, modifications, and variations fall within the scope of the invention disclosed herein and are therefore intended to be covered by the appended claims.

Although the present invention has been described with reference to preferred embodiments, workers skilled in the art will recognize that changes may be made in form and detail without departing from the spirit and scope of the invention.

What is claimed is:

1. An electronic device for assessing the condition of an electrochemical cell or battery having a dynamic conductance and an open-circuit voltage comprising:

means operably connected to said cell or battery for detecting said dynamic conductance and for generating a signal proportional thereto;

means operably connected to said cell or battery for sensing said open-circuit voltage;

correction means coupled to said means for detecting said dynamic conductance and directly electrically coupled to said means for sensing said open-circuit voltage, said correction means for responding to said open-circuit voltage by adjusting the level of said signal in accordance with said open-circuit voltage; and, means for displaying an assessment of said cell or battery in accordance with the adjusted level of said signal.

2. An electronic device as in claim 1 wherein said correction means adjusts said level of said signal in inverse correspondence with the value of said open-circuit voltage relative to a fully-charged value.

3. An electronic device as in claim 2 wherein said correction means comprises a correction amplifier having an input voltage and an output voltage, said input voltage being derived from said open-circuit voltage and said output voltage being proportional to said adjusted level of said signal.

4. An electronic device as in claim 3 wherein said correction amplifier comprises a reference voltage, a plurality of operational amplifier, a plurality of diodes, and a plurality of resistors interconnected to provide a piece-wise linear transfer function relating said output voltage to said input voltage.

5. An electronic device for assessing the condition of an electrochemical cell or battery having an internal resistance and a dc terminal voltage comprising:

means directly electrically coupled to said electrochemical cell or battery for generating a time-varying first signal inversely related to said dc terminal voltage;

current generating means coupled to said electrochemical cell or battery and to said means for generating a time-varying first signal, said current generating means for producing a second signal directly proportional to said first signal and inversely proportional to said internal resistance; and means coupled to said current generating means for sensing said second signal and for relating said second signal to said condition of said electrochemical cell or battery.

6. An electronic device as in claim 5 wherein said means for generating a time-varying first signal includes a nonlinear dc amplifier means for amplifying said dc terminal voltage and further includes a chopper means for chopping a dc output of said nonlinear dc amplifier means to produce said time-varying first signal.

7. An electronic device as in claim 6 wherein said nonlinear dc amplifier means has a piecewise-linear transfer function.

8. An electronic device for assessing the condition of an electrochemical cell or battery having a dc terminal voltage comprising:

means directly electrically coupled to said electrochemical cell or battery for generating a time-varying input signal inversely related to said dc terminal voltage;

high-gain amplifier means for providing an output signal;

internal feedback means including low-pass filter means for coupling said output signal to the input of said high-gain amplifier means;

external feedback means including feedback resistor means for coupling said output signal to said electrochemical cell or battery;

capacitive coupling means for coupling said input signal and a time-varying voltage across said electrochemical cell or battery to said input of said high-gain amplifier means; and, means coupled to said high-gain amplifier means for sensing said output signal and for relating said output signal to said condition of said electrochemical cell or battery.

9. An electronic device as in claim 8 wherein said means for generating a time-varying input signal includes a nonlinear dc amplifier means for amplifying said dc terminal voltage and further includes a chopper means for chopping a dc output of said nonlinear dc amplifier means to produce said time-varying input signal.

10. An electronic device as in claim 9 wherein said nonlinear dc amplifier means has a piecewise-linear transfer function.

11. An electronic device for assessing the condition of an electrochemical cell or battery having a dynamic parameter and an open-circuit voltage comprising:

means operably connected to said cell or battery for measuring said dynamic parameter;

means operably connected to said cell or battery for sensing said open-circuit voltage;

correction means coupled to said means for measuring said dynamic parameter and directly electrically coupled to said means for sensing said open-circuit voltage, said correction means for responding to said open-circuit voltage by adjusting a measured dynamic parameter value in accordance with said open-circuit voltage to obtain a corrected dynamic parameter value; and means for displaying an assessment of said condition of said electrochemical cell or battery in conformance with said corrected dynamic parameter value.

12. An electronic device in accordance with claim 11 including means for providing a special indication when said open-circuit voltage is less than a predetermined value and further including means for suppressing said assessment when said open-circuit voltage is less than a predetermined value.

13. An electronic device in accordance with claim 11 wherein said dynamic parameter is dynamic conductance and said correction means includes correction amplifier means having an input voltage and an output voltage, said input voltage being proportional to said open-circuit voltage and said output voltage being proportional to the ratio of said corrected dynamic conductance value to said measured dynamic conductance value.

14. An electronic device in accordance with claim 11 wherein said dynamic parameter is dynamic conductance and said correction means comprises a firmware correction program implemented by microprocessor means and wherein digital representations of said open-circuit voltage and said dynamic conductance are both inputted to said microprocessor and combined algorithmically to obtain said corrected dynamic conductance value based upon said firmware correction program.

15. An electronic device in accordance with claim 11 wherein said dynamic parameter is dynamic resistance and said correction means comprises a firmware correction program implemented by a microprocessor, and wherein digital representations of said open-circuit voltage and said dynamic resistance are both inputted to said microprocessor and combined algorithmically to obtain said corrected dynamic resistance value based upon said firmware correction program.

16. An electronic device in accordance with claim 11 wherein said assessment comprises numbers proportional to said corrected dynamic parameter value.

17. An electronic device in accordance with claim 11 wherein said assessment comprises a qualitative assessment in conformance with said corrected dynamic parameter value relative to a reference dynamic parameter value.

18. An electronic device in accordance with claim 17 wherein said electrochemical cell or battery has an electrical rating, said electronic device includes means for inputting the value of said rating, and said reference dynamic parameter value is determined by the particular value of said electrical rating thus inputted.

19. An electronic device for assessing the condition of an electrochemical cell or battery having a dynamic conductance, an open-circuit voltage, and a state-of-charge comprising:

means operably connected to said cell or battery for determining a digital representation of said dynamic conductance;

means directly electrically connected to said cell or battery for determining a digital representation of said open-circuit voltage;

microprocessor means for implementing a firmware correction program, said microprocessor means directly electrically coupled to said means for determining a digital representation of said dynamic conductance and to said means for determining a digital representation of said open-circuit voltage and algorithmically combining said digital representation of said dynamic conductance with said digital representation of said open-circuit voltage to obtain an assessment result representative of said dynamic conductance corrected to represent its presumed value at 100% state-of-charge based upon said firmware correction program; and means for displaying said assessment result.

20. An electronic device as in claim 19 wherein said assessment result comprises numbers proportional to said dynamic conductance corrected to represent its presumed value at 100% state-of-charge.

21. An electronic device as in claim 19 wherein said assessment result comprises a qualitative result determined in accordance with the value of said dynamic conductance corrected to represent its presumed value at 100% state-of-charge relative to a reference value.

22. An electronic device as in claim 21 wherein said electrochemical cell or battery has an electrical rating and said electronic device includes means for inputting said electrical rating to said microprocessor means, said reference value being determined by the particular value of said electrical rating thus inputted.

23. An electronic device for assessing the condition of an electrochemical cell or battery having a dynamic resistance, an open-circuit voltage, a state-of-charge, and an electrical rating, comprising:

means operably connected to said cell or battery for determining a digital representation of said dynamic resistance;

means directly electrically connected to said cell or battery for determining a digital representation of said open-circuit voltage;

microprocessor means for implementing a firmware correction program, said microprocessor means directly electrically coupled to said means for determining a digital representation of said dynamic resistance and to said means for determining a digital representation of said open-circuit voltage and algorithmically combining said digital representation of said dynamic resistance with said digital representation of said open-circuit voltage based upon said firmware correction program thereby evaluating a reciprocal dynamic resistance corrected to represent its presumed value at 100% state-of charge;

means for inputting said electrical rating to said microprocessor means for determining a reference quantity therefrom;

means for comparing said reference quantity with said reciprocal dynamic resistance corrected to represent its presumed value at 100% state-of-charge; and means for displaying a qualitative assessment of said condition of said electrochemical cell or battery in accordance with said comparison.

24. An electronic device as in claim 23 including means for suppressing said qualitative assessment and for providing a special indication when said open-circuit voltage is less than a predetermined value.

25. An electronic device for assessing the condition of an electrochemical cell or battery having a dynamic resistance, an open-circuit voltage, a state-of-charge, and an electrical rating comprising:

means operably connected to said cell or battery for determining a digital representation of said dynamic resistance;

means directly electrically connected to said cell or battery for determining a digital representation of said open-circuit voltage;

microprocessor means for implementing a firmware correction program, said microprocessor means directly electrically coupled to said means for determining a digital representation of said dynamic resistance and to said means for determining a digital representation of said open-circuit voltage and algorithmically combining said digital representation of said dynamic resistance with said digital representation of said open-circuit voltage based upon said firmware correction program thereby evaluating a dynamic resistance corrected to represent its presumed value at 100% state-of-charge;

means for inputting said electrical rating to said microprocessor means for determining a reference quantity therefrom;

means for comparing said reference quantity with said dynamic resistance corrected to represent its presumed value at 100% state-of-charge; and, means for displaying a qualitative assessment of said condition of said electrochemical cell or battery in accordance with said comparison.

26. An electronic device as in claim 25 including means for suppressing said qualitative assessment and for providing a special indication when said open-circuit voltage is less than a predetermined value.

\* \* \* \* \*